United States Patent

Pigott et al.

[11] Patent Number: 6,069,493
[45] Date of Patent: May 30, 2000

[54] INPUT CIRCUIT AND METHOD FOR PROTECTING THE INPUT CIRCUIT

[75] Inventors: John M. Pigott, Phoenix, Ariz.; Stephan Ollitrault, Seysses, France; Damon Peter Broderick, Munich, Germany

[73] Assignee: Motorola, Inc., Schaumburg, Ill.

[21] Appl. No.: 08/980,250

[22] Filed: Nov. 28, 1997

[51] Int. Cl.[7] ........................ H03K 19/0175; H03K 17/16
[52] U.S. Cl. ............................... 326/83; 326/33; 326/34; 326/80; 327/389
[58] Field of Search .................... 327/427, 434, 327/389, 309; 326/21, 33, 34, 80, 83, 86; 361/111, 56

[56] References Cited

U.S. PATENT DOCUMENTS

| | | | |
|---|---|---|---|
| 3,622,798 | 11/1971 | Ochi et al. .......................... | 377/105 |
| 4,057,844 | 11/1977 | Smedley ............................. | 361/111 |
| 4,928,053 | 5/1990 | Sicard et al. ...................... | 323/284 |
| 5,270,589 | 12/1993 | Sawada et al. .................... | 307/475 |
| 5,319,259 | 6/1994 | Merrill ............................. | 326/21 |
| 5,604,655 | 2/1997 | Ito .................................. | 361/56 |
| 5,751,168 | 5/1998 | Speed III et al. ................. | 326/83 |

*Primary Examiner*—Michael Tokar
*Assistant Examiner*—Richard Roseen
*Attorney, Agent, or Firm*—Anthony M. Martinez; Rennie William Dover

[57] ABSTRACT

An input circuit (20) and a method for protecting the input circuit (20) from positive and negative overvoltages. The input circuit (20) includes an N-channel Metal Oxide Semiconductor Field Effect Transistor (MOSFET) (12), a P-channel MOSFET (13), a Zener diode (21), and a diode-connected transistor (22). The P-channel MOSFET (13) protects the N-channel MOSFET (12) from negative overvoltages. The Zener diode (21) and the diode-connected transistor (22) protect the N-channel MOSFET (12) from positive overvoltages. In addition, the Zener diode (21) protects the P-channel MOSFET (13) from positive overvoltages.

18 Claims, 1 Drawing Sheet

INPUT CIRCUIT AND METHOD FOR PROTECTING THE INPUT CIRCUIT

BACKGROUND OF THE INVENTION

The present invention relates, in general, to protection circuitry and, more particularly, to high voltage protection of input circuitry.

It is well known that monolithic integrated circuits may become damaged by exposing their input terminals to large abnormal voltages. These large abnormal voltages can rupture the dielectric materials within the integrated devices such as gate oxides or it may melt conductive materials such as polysilicon or aluminum interconnects, thereby irreparably damaging the integrated circuits.

Generally, integrated circuit manufacturers include protection devices that shunt current away from input circuitry within integrated devices to prevent the integrated devices from being damaged by large voltage transients. One technique for protecting integrated device input circuitry is to improve the energy dissipation capability of the protection circuitry. This is done by laying out the protection circuit to have larger geometries, wider metal interconnects, more and larger contacts, etc. A disadvantage of this approach is it increases the size of the integrated device, thereby decreasing the number of integrated circuits per semiconductor wafer and increasing the cost of manufacturing the integrated circuits.

Accordingly, it would be advantageous to save a circuit for protecting input circuitry from damaging overvoltages. It would be of further advantage for the circuit to occupy a small area and be compatible with standard processing techniques. In addition, it would be further advantage for the circuit to not affect the operation of components external to the circuit by not drawing large currents while protecting the input circuitry.

DETAILED DESCRIPTION OF THE DRAWINGS

Generally, the present invention provides an input circuit or input device and a method for protecting the input circuit or input device from damaging positive and negative overvoltages. In addition, the input circuit prevents currents generated by large input voltages from flowing into the input circuit. These currents can degrade the performance of the input circuit and affect the performance of components connected to the input circuit.

Figure 1:
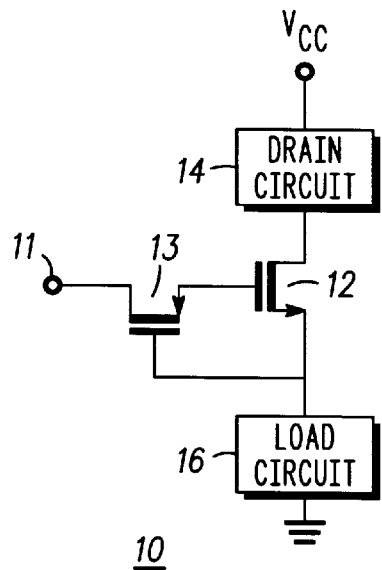
FIG. 1 is a schematic diagram of an input circuit in accordance with a first embodiment of the present invention.

FIG. 1 is a schematic diagram of an input circuit 10 having an input section 12 coupled to an input terminal 11 via a protection section 13 in accordance with a first embodiment of the present invention. Protection section 13 is also referred to as a protection circuit. By way of example, input section 12 is an N-channel Metal Oxide Semiconductor Field Effect Transistor (MOSFET) and protection section 13 is a P-channel MOSFET. The source and the gate of P-channel MOSFET 13 are connected to the gate and the source of N-channel MOSFET 12, respectively. The drain of P-channel MOSFET 13 is connected to input terminal 11. The drain of MOSFET 12 is coupled for receiving a power supply voltage such as, for example, a voltage Vcc, via a drain circuit 14. Voltage Vcc is also referred to as a supply voltage of MOSFET 12. Suitable components for drain circuit 14 include resistors, diodes, transistors, etc. In addition, the drain of MOSFET 12 can be directly connected to a power supply terminal, which in turn is coupled for receiving the voltage Vcc. The source of MOSFET 12 is coupled for receiving a power supply voltage such as, for example, ground, via a load circuit 16. Suitable components for load circuit 16 include resistors, diodes, transistors, etc.

Although transistors 12 and 13 are shown as being Field Effect Transistors (FETs), this is not a limitation of the present invention. In other words, transistors 12 and 13 can be bipolar transistors. It should be noted that the gate of a Field Effect Transistor (FET) is also referred to as a control electrode and the drain and the source of a FET are referred to as current carrying electrodes. Likewise, the base of a bipolar transistor is referred to as a control electrode and the collector and emitter electrodes of a bipolar transistor are also referred to as current carrying electrodes. It should be further noted that an N-channel FET and an NPN bipolar transistor have majority carriers of an N conductivity type. A P-channel FET and a PNP bipolar transistor have majority carriers of a P conductivity type. Therefore, an N-channel FET and an NPN bipolar transistor are referred to as transistors having carriers of an N conductivity type or merely transistors of an N conductivity type. Likewise, a P-channel FET and a PNP bipolar transistor are referred to as transistors of a P conductivity type.

Figure 2:
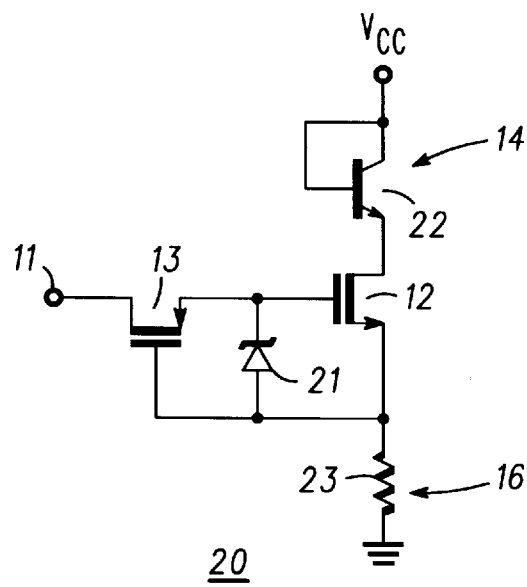
FIG. 2 is a schematic diagram of an input circuit in accordance with a second embodiment of the present invention.

FIG. 2 is a schematic diagram of an input circuit 20 having input section 12 and protection section 13 as described with reference to FIG. 1 in accordance with a second embodiment of the present invention. It should be understood that the same reference numerals are used in the figures to denote the same elements. Input circuit 20 includes a breakdown diode 21 having an anode connected to the source of MOSFET 12 and a cathode connected to the gate of MOSFET 12. By way of example, breakdown diode 21 is a Zener diode. Drain circuit 14 is a diode-connected NPN bipolar transistor 22 having its collector connected to its base and the collector and the base commonly coupled for receiving a power supply voltage such as, for example, voltage Vcc. The emitter of diode-connected transistor 22 is connected to the drain of MOSFET 12. Because NPN bipolar transistor 22 is connected as a diode, it is also referred to as a diode. The emitter of NPN bipolar transistor 22 forms a cathode of diode 22 and the commonly connected base and collector of NPN bipolar transistor 22 forms an anode of diode 22.

By way of example, load circuit 16 is a resistor 23 having a first terminal connected to the source of MOSFET 12 and a second terminal coupled for receiving a power supply voltage such as, for example, ground.

In operation, input terminal 11 is coupled for receiving an input voltage. During normal operation, i.e., when the input voltage is between voltage Vcc and ground, MOSFET 12 operates as a source follower. In other words, the source of MOSFET 12 follows the input voltage. More particularly, when the input voltage is above a threshold voltage of MOSFET 13, MOSFET 13 turns on and couples the input voltage to the gate of MOSFET 12. When MOSFET 13 is on and the input voltage is above the threshold voltage of MOSFET 12, MOSFET 12 turns on and the voltage at the source of MOSFET 12 follows the input voltage, i.e., the voltage at the source of MOSFET 12 is the input voltage minus the threshold voltage of MOSFET 12. Likewise, since the source of MOSFET 12 is connected to the first terminal of resistor 23, the voltage at resistor 23 follows the input voltage, i.e., the voltage at resistor 23 is the input voltage minus the threshold voltage of MOSFET 12. Preferably, diode 21 has a reverse breakdown voltage greater than approximately the threshold voltage of MOSFET 12 and does not conduct current during normal operation. Therefore, current does not flow into input terminal 11 during normal operation. Since input circuit 20 provides an input circuit that follows the input voltage without drawing current from input terminal 11, input circuit 20 can be used as an input circuit to monitor input voltages such as, for example, input voltages from a data bus signal. In addition, input circuit 20 can be used as an input circuit to an input level detector.

During a negative overvoltage, i.e., when the input voltage is less than ground, MOSFET 13 is off. When MOSFET 13 is off, input circuit 20 is electrically isolated from the input voltage, thereby protecting input circuit 20. Input circuit 20 remains electrically isolated for large negative overvoltages, i.e., negative overvoltages approximately equal to the breakdown voltage between the drain and the source of MOSFET 13.

A positive overvoltage occurs when the input voltage is greater than voltage Vcc plus the reverse breakdown voltage of diode 21. During a positive overvoltage, MOSFET 13 is on and diode 21 conducts current from input terminal 11. The voltage between the gate and the source of MOSFET 12 is clamped to a voltage equal to the reverse breakdown voltage of diode 21, thereby protecting the gate oxide of MOSFET 12 from an overvoltage between its gate and source. Similarly, MOSFET 13 is protected since the voltage between the gate and the source of MOSFET 13 is clamped at the reverse breakdown voltage of diode 21.

The voltage at the first terminal of resister 23 and at the source of MOSFET 12 follows the input voltage, i.e., the voltage at the first terminal of resistor 23 and at the source of MOSFET 12 follows the input voltage minus the reverse breakdown voltage of diode 21. When diode 21 is conducting, diode 22 prevents a drain-source current from flowing in MOSFET 12, thereby adding protection to the gate oxide of MOSFET 12. In other words, MOSFET 12 is isolated from supply voltage Vcc by diode 22 during a positive overvoltage. In summary, MOSFET 13 provides protection from negative overvoltages. Diodes 21 and 22 provide protection from positive overvoltages.

Figure 3:
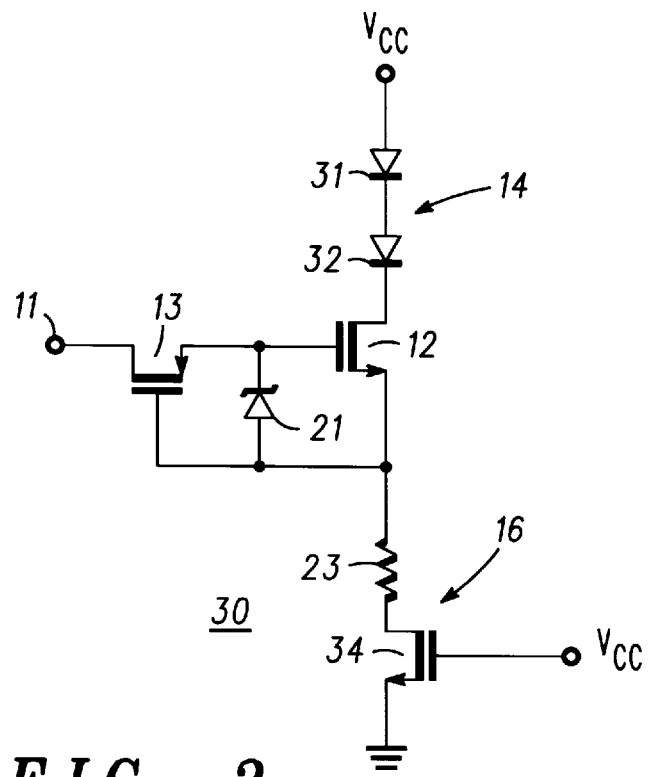
FIG. 3 is a schematic diagram of an input circuit in accordance with a third embodiment of the present invention.

FIG. 3 is a schematic diagram of a input circuit 30 having input section 12, protection section 13, and diode 21 as described with reference to FIG. 2 in accordance with a third embodiment of the present invention. It should be understood that the same reference numerals are used in the figures to denote the same elements. Drain circuit 14 is comprised of series connected diodes 31 and 32. The cathode of diode 32 is connected to the drain of MOSFET 12 and the anode of diode 32 is connected to the cathode of diode 31. The anode of diode 31 is coupled for receiving a power supply voltage such as, for example, voltage Vcc. Diodes 31 and 32 can be diode-connected transistors.

In the third embodiment, load circuit 16 includes resistor 23 connected to an N-channel MOSFET 34. The first terminal of resistor 23 is connected to the source of MOSFET 12 and the second terminal of resistor 23 is connected to the drain of MOSFET 34. The gate of MOSFET 34 is coupled for receiving a power supply voltage such as, for example, voltage Vcc. The source of MOSFET 34 is coupled for receiving a power supply voltage such as, for example, ground.

The operation of input circuit 30 is similar to the operation of input circuit 20 except when voltage Vcc is at approximately ground or when the power supply providing voltage Vcc is not connected to input circuit 30. Under these conditions for voltage Vcc, MOSFET 34 is off and current does not flow into input terminal 11.

By now it should be appreciated that an input circuit and a method for protecting the input circuit from positive and negative overvoltages, such as 24 volts and −20 volts, respectively have been provided. An advantage of the present invention is that it does not draw current during normal operation and when a power supply voltage is not connected to the input circuit. Another advantage of the present invention is that it can be manufactured using standard semiconductor processing techniques.

What is claimed is:

1. An input circuit, comprising:
   a P-channel Field Effect Transistor (FET) having a control electrode, a first current carrying electrode, and a second current carrying electrode;
   a first transistor having a control electrode coupled to the second current carrying electrode of the P-channel FET, a first current carrying electrode coupled to the control electrode of the P-channel FET, and a second current carrying electrode coupled for receiving a first power supply voltage.
   a resistor having a first terminal coupled to the first current carrying electrode of the first transistor and a second terminal; and
   a second transistor having a control electrode coupled for receiving the first power supply voltage, a first current carrying electrode coupled to the second terminal of the resistor, and a second current carrying electrode coupled for receiving a second power supply voltage.

2. The input circuit of claim 1, wherein the first transistor is an N-channel Metal Oxide Semiconductor Field Effect Transistor (MOSFET).

3. The input circuit of claim 1, further comprising a diode having an anode coupled to the control electrode of the P-channel FET and a cathode coupled to the control electrode of the first transistor.

4. The input circuit of claim 3, wherein the diode is a Zener diode.

5. The input circuit of claim 1, wherein the second transistor is an N-channel MOSFET.

6. The input circuit of claim 1, wherein the second current carrying electrode of the first transistor is coupled for receiving the first power supply voltage via a plurality of diodes.

7. A circuit, comprising:
   a first transistor of a first conductivity type having a control electrode, a first current carrying electrode, and a second current carrying electrode;
   a second transistor of a second conductivity type having a control electrode coupled to the second current carrying electrode of the first transistor, a first current carrying electrode coupled to the control electrode of the first transistor, and a second current carrying electrode coupled for receiving a first power supply voltage; and
   a second diode, wherein the second current carrying electrode of the second transistor is coupled for receiving the first power supply voltage via the second diode.

8. The circuit of claim 7, wherein the diode is a diode-connected transistor.

9. The circuit of claim 7, further comprising a resistor having a first terminal coupled to the first current carrying electrode of the second transistor and a second terminal coupled for receiving a second power supply voltage.

10. A circuit, comprising:
- a first transistor of a first conductivity type having a control electrode, a first current carrying electrode, and a second current carrying electrode;
- a second transistor of a second conductivity type having a control electrode coupled to the second current carrying electrode of the first transistor, a first current carrying electrode coupled to the control electrode of the first transistor, and a second current carrying electrode coupled for receiving a first power supply voltage;
- a resistor having a first terminal coupled to the first current carrying electrode of the second transistor and a second terminal; and
- a third transistor of the second conductivity type having a control electrode coupled for receiving the first power supply voltage, a first current carrying electrode coupled to the second terminal of the resistor, and a second current carrying electrode coupled for receiving a second power supply voltage.

11. The circuit of claim 10, wherein the first transistor of the first conductivity type is a P-channel MOSFET.

12. The circuit of claim 10, wherein the second transistor of the second conductivity type is an N-channel MOSFET.

13. The circuit of claim 10, further comprising a diode having an anode coupled to the control electrode of the first transistor and a cathode coupled to the control electrode of the second transistor.

14. The circuit of claim 13, wherein the diode is a Zener diode.

15. A circuit, comprising:
- a first transistor of a first conductivity type having a control electrode, a first current carrying electrode, and a second current carrying electrode;
- a second transistor of a second conductivity type having a control electrode coupled to the second current carrying electrode of the first transistor, a first current carrying electrode coupled to the control electrode of the first transistor, and a second current carrying electrode coupled for receiving a first power supply voltage; and
- a third transistor of the second conductivity type having a control electrode coupled for receiving the first power supply voltage, a first current carrying electrode coupled to the first current carrying electrode of the second transistor, and a second current carrying electrode coupled for receiving a second power supply voltage.

16. The circuit of claim 15, wherein the second current carrying electrode of the second transistor is coupled for receiving the first power supply voltage via a fourth transistor, wherein the fourth transistor has a first current carrying electrode coupled to the second current carrying electrode of the second transistor, a second current carrying electrode coupled for receiving the first power supply voltage, and a control electrode coupled to the second current carrying electrode of the fourth transistor.

17. The circuit of claim 16, wherein the first transistor is a P-channel Field Effect Transistor (FET).

18. The circuit of claim 17, wherein the fourth transistor is an NPN bipolar transistor.

* * * * *